United States Patent [19]

Pyndiah et al.

[11] Patent Number: 5,563,897
[45] Date of Patent: Oct. 8, 1996

[54] METHOD FOR DETECTING INFORMATION BITS PROCESSED BY CONCATENATED BLOCK CODES

[75] Inventors: Ramesh Pyndiah; Alain Glavieux, both of Plouzane; Claude Berrou, Le Conquet, all of France

[73] Assignee: France Telecom, Paris, France

[21] Appl. No.: 345,370

[22] Filed: Nov. 18, 1994

[30] Foreign Application Priority Data

Nov. 19, 1993 [FR] France ................................ 93 13858

[51] Int. Cl.$^6$ .................................................. H03M 13/00
[52] U.S. Cl. ........................................ 371/37.4; 371/37.1
[58] Field of Search .............................................. 371/37.4

[56] References Cited

U.S. PATENT DOCUMENTS 5,181,207  1/1993  Chapman .

FOREIGN PATENT DOCUMENTS 0229698  7/1987  European Pat. Off. .
0481752  4/1992  European Pat. Off. .
2180966  4/1987  United Kingdom .

OTHER PUBLICATIONS

IEEE Transactions on Information Theory, vol. 36, N°3, May 1990, New York US–"On decoding concatenated codes" –Hassan & Stark pp. 677–683.

IEE Proceedings I. Solid–State & Electronic Devices, vol. 136, N°1 Feb. 1989, "Error control techniques applicable to HF channels" Bate & Honary & Farrell–pp. 57–63.

Proceedings ICC'93, Geneva, May 1993–"Separable MAP filters for the decoding of product and concatenated codes" –Lodge et al. pp. 1740–1745.

IEEE Transactions on Information Theory, vol. IT 20, Mar. 1974 "Optimal Decoding of Linear Codes for Minimizing Symbol Error Rate" –BAHL et al–pp. 284–287.

IEEE Transactions on Information Theory, vol. IT 18, N°1, Jan. 1972–"Random Error and Burst Correction by Iterated Codes" –S. M. Reddy et al–pp. 182–185.

*Primary Examiner*—Roy N. Envall, Jr.
*Assistant Examiner*—Yoncha L. Kundupoglu
*Attorney, Agent, or Firm*—Larson and Taylor

[57] ABSTRACT

The transmitted bits are coded according to the product of at least two systematic block codes. An iterative decoding is applied in order to determine, at each code word search step, a data matrix and a decision matrix which are used for the following step. The new decision matrix is determined at each step by decoding the rows or the columns of the input matrix, and the new data matrix is determined by taking account of correction terms which increase the reliability of the decoding at each iteration. The method is especially suited for use with high-efficiency block codes.

31 Claims, 7 Drawing Sheets

METHOD FOR DETECTING INFORMATION BITS PROCESSED BY CONCATENATED BLOCK CODES

BACKGROUND OF THE INVENTION

The present invention relates to digital transmission, in which block coding is used to correct transmission errors.

On the subject of digital transmission of information (speech, image, data, etc.), a distinction is usually made between source coding and channel coding. Source coding forms the binary representation of the signal to be transmitted. It is normally designed as a function of the nature of the signal to be transmitted. Much effort has been expended in recent years on the subject of source coding in order to reduce the digital rate, while preserving good transmission quality. However, these new source coding techniques require better protection of the bits against perturbations during the transmission. Moreover, the physical and economic limitations of high-frequency components (noise factor, power saturation), as well as regulations on the level of power allowed for transmission limit the range of digital transmission systems.

For this reason much work has been carried out on the subject of channel coding, in particular on the subject of block coding. This type of error-correcting coding consists in adding n-k redundancy bits to k information bits originating from the source coding, and in using these redundancy bits on reception in order to correct certain transmission errors. The ratio R=k/n is called the efficiency of the code, and the coding gain G is defined as the ratio, expressed in decibels, between the energies per information bit Eb which are necessary at the input of the receiver without coding and with coding in order to reach a given binary error rate (BER). A typical objective is to design coders and more particularly the associated decoders so that: (i) the coding gain G is as high as possible (G>5 dB for BER=$10^{-5}$), (ii) the efficiency of the code is as high as possible (R>0.6), and (iii) the decoding complexity is as low as possible.

The case of the storage of the digital information may be seen as a particular case of transmission, in which the propagation channel includes a memory where the information remains in more or less long-term storage, the transmitter and the receiver being the same or not. It will thus be understood that, in general, the notions of channel coding and of associated decoding are applicable to the field of the storage of information in the same way as to transmission, the errors to be corrected then being those due to the reading or to the writing in the memory, to the alteration in the content of the memory or also to communications (remote or not) with the devices for reading and writing in the memory.

It is known to enhance the performance of error-correcting codes by using concatenation techniques. In particular, the technique of product codes, which is more particularly involved with the present invention, makes it possible, from two simple block codes (that is to say having a small minimum Hamming distance d) to obtain a code whose minimum Hamming distance is equal to the product of the Hamming distances of the elementary codes used.

If a block code with parameters $(n_1,k_1,d_1)$ is designated by $C_1$ and a block code with parameters $(n_2,k_2,d_2)$ is designated by $C_2$, the application of the code which is the product of $C_1$ with $C_2$ consists in ordering the $k_1 \times k_2$ successive information bits in a matrix, and in coding the $k_1$ rows of the matrix by the code $C_2$, then the $n_2$ columns of the resultant matrix by the code $C_1$. The parameters of the product code P are then given by ($n=n_1 \times n_2$; $k=k_1 \times k_2$; $d=d_1 \times d_2$). The efficiency R of the code P is equal to $R_1 \times R_2$. Decoding of the code P according to the maximum likelihood a posteriori (MLP) makes it possible to reach optimal performance. The maximum asymptotic coding gain can then be approximated by the relation $G<10 \log_{10} (R \cdot d)$.

The product code is thus very beneficial, but decoding according to the MLP is generally too complex, except in the case of short block codes.

In the article "On decoding iterated codes", IEEE Trans. on Information theory, Vol. IT-16, No. 5, September 1970, pages 624–627, S. M. Reddy proposes an algorithm for decoding a product code constructed from elementary codes which are decodable by an algebraic decoder, which can be summarized in three steps:

- decoding the columns of the coded matrix by using an algebraic decoder,
- generating, for each column, an estimate of the reliability of the decoded bits based on the number of corrected bits, and
- decoding the rows by an algebraic decoder, by making use of the reliability determined during the decoding of the columns.

This decoding algorithm is sub-optimal with respect to the MLP, and does not make it possible to make full use of all the resources of the product code.

In their article "Separable MAP filters for the decoding of product and concatenated codes", Proc. ICC'93, Geneva, pages 1740–1745, May 1993, J. Lodge et al. proposed an iterative decoding algorithm comprising the following steps:

- decoding the columns by using the Bahl algorithm (see L. R. Bahl et al., "Optimal decoding of linear codes for minimizing symbol error rate", IEEE Trans. on Information Theory, Vol. IT-20, pages 248–287, March 1974) which estimates the logarithmic likelihood ratios (LLR) of the bits,
- decoding the rows by using the Bahl algorithm and by taking, as input data, the likelihoods (LLR) calculated during the decoding of the columns, and
- recommencing the decoding of the columns with, as input data, the likelihoods (LLR) calculated during the decoding of the lines.

The decoding of the columns is reiterated several times followed by the decoding of the rows. This algorithm, although it leads to performance superior to that of the Reddy algorithm, is applicable only for short-length codes, for example the Hamming code (16,11,3). This is due to the fact that the Bahl algorithm uses the trellis associated with the block codes, which grows exponentially as a function of n-k. This algorithm can thus not be used in practice for high-efficiency codes such as, for example, the BCH code (63,51,5).

An object of the present invention is to propose a method of transmitting information bits involving a mode of decoding product codes which is well adapted to the case of high-efficiency codes.

SUMMARY OF THE INVENTION

The invention thus proposes a method for detecting information bits in a coded digital signal, within a receiver, the coding of the said digital signal having been performed within a transmitter by applying, to information bits to be transmitted, a block code corresponding to the product of at least two elementary systematic block codes, the method comprising an iterative decoding phase including a number m of decoding cycles, each decoding cycle successively including code word search steps for each elementary block code used in the product code. At each code word search step, a data matrix and a decision matrix with binary components are received which, before the first search step of the iterative decoding phase consist respectively of an input matrix consisting of samples of the received signal and of a matrix, the components of which are those of the input matrix put into binary form, and a new decision matrix and a new data matrix are produced for the following search step. The decoded information bits are extracted from the decision matrix produced during the last code word search step. Each code word search step includes a division of the data matrix received into data vectors each corresponding to a code word of the elementary code and a corresponding division of the decision matrix received into decision vectors, and the following substeps for respectively processing at least some of the data vector/decision vector pairs:

determining a number p of indices for which the components of the data vector are the least reliable;

constructing a number q of binary words to be decoded from the said p indices and from the decision vector;

obtaining q' code words on the basis of algebraic decodings of the decision vector and of the q binary words to be decoded;

selecting, among the q' code words obtained, the one having the smallest euclidean distance from the data vector;

calculating a correction vector, each component $W_j$ of the correction vector being calculated respectively by determining a possible concurrent word having its j-th component different from that of the selected code word, and by applying the formula:

$$W_j = \left( \frac{(M^c - M^d)}{4} - C_j^d \cdot R_j' \right) C_j^d \quad (1)$$

when a concurrent word has been determined, $M^d$ and $M^c$ respectively designating the euclidean distances, with respect to the data vector, of the selected code word and of the concurrent word, and $C_j^d$ and $R_j'$ respectively designating the j-th components of the selected code word and of the data vector;

obtaining the new decision vector taken to be equal to the said selected code word; and calculating the new data vector by adding the correction vector multiplied by a first confidence coefficient to the corresponding input vector extracted from the input matrix.

Preferably, the calculation of each component $W_j$ of the correction vector in the absence of determination of a concurrent word relative to this component is performed according to the formula:

$$W_j = \beta_i C_j^d$$

where $\beta_i$ designates a second confidence coefficient. Not finding a concurrent word for a bit j generally means that the estimate of this bit by the code word which has just been selected is relatively reliable. For this reason, a correction $W_j$ is provided which is proportional to the corresponding component of the selected word, the proportionality factor $\beta_i$ being preferably increasing in step with the code word search steps.

In a first implementation of the method, procuring optimal decoding performance, the determination of a possible concurrent word relative to the j-th component of the selected code word comprises the determination, among the q' code words obtained, of those having their j-th component different from that of the selected code word and the selection as concurrent word of that one of the code words thus determined having the smallest euclidean distance with the data vector, no concurrent word being determined when the q' code words obtained all have their j-th component equal to that of the selected code word. In general it is desired that the components of the correction vector be calculated by identifying a concurrent word and by applying Formula (1) in the cases where the estimate of the corresponding bits is relatively unreliable. The first implementation set out above, in which a relatively high number of binary words are typically decoded, gives rise to a good probability of finding both the optimal code word and the best potential concurrent words for the relatively unreliable components, so that each iteration of a code word search step makes it possible substantially to enhance the reliability of the decisions.

The fact of having to decode a relatively high number of binary words at each iteration (typically $q \geq 15$) requires not inconsiderable calculating power. For certain decoders, it may be preferred to slightly reduce the performance in terms of BER in order to substantially facilitate implementation of the decoding. One possibility is to apply the second implementation of the method according to the invention, in which the determination of a possible concurrent word relative to the j-th component of the selected code word comprises a comparison between the j-th component of the decision vector and that of the selected code word, the decision vector being taken as concurrent word when its j-th component is different from that of the selected code word, and no concurrent word being determined in the opposite case. It is then possible substantially to reduce the number q of the binary words to be decoded (typically $q \leq 6$), since it is sufficient to find an optimal code word among the results of the q+1 decodings, without additionally having to find potential concurrent words for the various unreliable components of the input vector, the decision vector obtained at the preceding iteration being the only candidate concurrent word.

Obviously, the simplification contributed by the second implementation with respect to the first has the counterpart of a certain degradation in the decoding performance. This degradation may be acceptable for certain applications, and it may moreover be limited by appropriate arrangements. According to one of these arrangements, the obtaining of the q' code words comprises, for each code word resulting from the algebraic decoding of the decision vector or of one of the q binary words to be decoded, the identification of the components of the associated input vector having a sign opposite to that of the corresponding component of the said code word, the said code word being adopted among the q' code words only if the absolute values of the said components of opposite sign of the input vector are all less than a preestablished threshold. Thus, modifying reliable binary elements is avoided, especially during the first iterations. Preferably, the above-mentioned threshold increases in step with the code word search steps.

A second aspect of the invention relates to a method for transmitting information bits, comprising: a coding phase in which a block code, corresponding to the product of at least two elementary systematic block codes, is applied to the information bits to be transmitted; a phase of modulation and of transmission of a signal obtained from the coded information bits; a phase of reception of the transmitted signal after propagation and of demodulation; and an iterative decoding phase executed in accordance with the above-described method, in order to detect the information bits in the received signal after demodulation.

A third aspect of the invention relates to a method for retrieving information bits stored in coded form in a memory, the coding of the said bits having been performed by applying a block code corresponding to the product of at least two elementary systematic block codes, the said method comprising a phase of reading in the memory and a phase of iterative decoding, performed in accordance with the above-described method, in order to detect the information bits in the signal supplied by the read phase.

DESCRIPTION OF PREFERRED EMBODIMENTS

Figure 1:
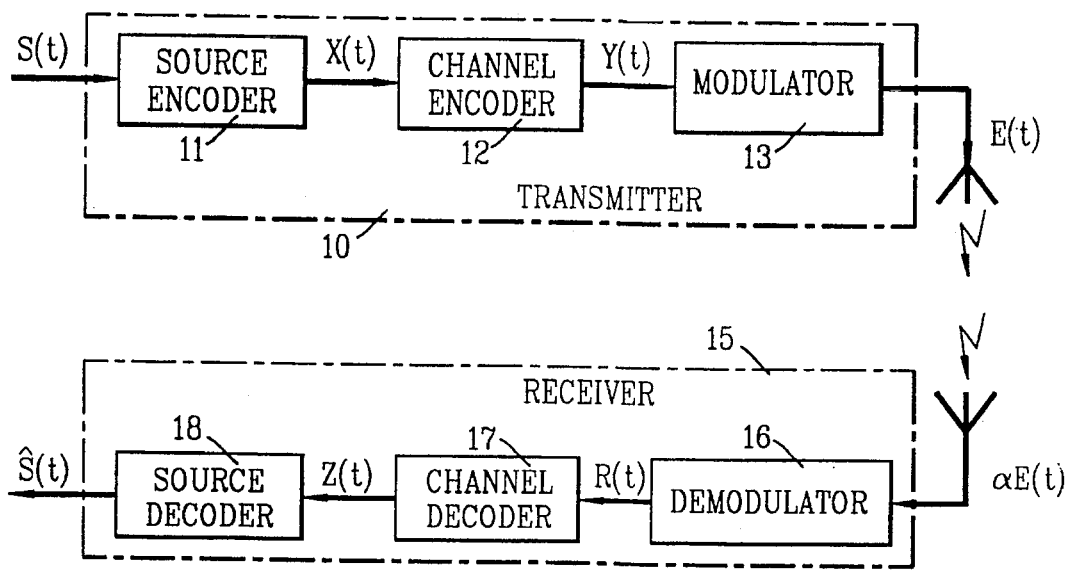
FIG. 1 is a block diagram of a digital transmission chain which can be used to implement the method according to the invention.

In the transmission chain illustrated in FIG. 1, the information bits to be transmitted $a_j$ are contained in a signal $$X(t) = \sum_j a_j h(t - jT)$$

addressed to the input of the channel coder 12 of the transmitter 10. This signal X(t) is formed by the source coder 11 from an analog signal S(t). The source coder 11 is conventionally such that the $a_j$ are independent and take the value 0 or 1 with equal probability. h(t) designates a time gate of duration T which is the time interval separating two successive bits. The channel coder 12 applies a block coding to produce a signal $$Y(t) = \sum_j c_j h(t - jT')$$

where the $c_j$ are the coded bits and T' is the time interval separating two coded bits (T'<T). The modulator 13 converts the sequence Y(t) into signal sequences which are compatible with the propagation channel. In the case of two-state phase shift keying associated with a radio channel, an example of the signal sent is given by:

$$E(t) = \sum_j e_j h(t - jT_s) \sin(2\pi f_0 t)$$

where $f_0$ is the frequency of the carrier wave and $e_j = 2 \cdot c_j - 1$. The signal received at the antenna of the receiver 15 is attenuated by a coefficient $\alpha$. The demodulator 16 derives the probability ratio for each bit, which may be expressed:

$$R_j = e_j + B_j$$

where the samples $B_j$ are the noise samples induced by the propagation channel, which are independent of the bits $c_j$, and not correlated with each other, with an average of 0 and with standard deviation $\sigma$, depending on the signal-to-noise ratio. The signal at the output of the demodulator 16 is then equal to:

$$R(t) = \sum_j R_j h(t - jT')$$

The channel decoder 17 next takes the decision relating to the bits sent by taking advantage of the channel coding used on sending in order to minimize the errors. Its output signal is given by:

$$Z(t) = \sum_j \hat{a}_j h(t - jT)$$

where the bits $\hat{a}_j$ are the decisions taken by the channel decoder. The source decoder 18 next reconstructs the analog signal S(t) from the bits supplied by the channel decoder 17.

The invention resides principally in the channel coder 12 and the channel decoder 17. Thus it will be understood that it is compatible with various types of source coding/decoding, of modulation/demodulation and of propagation channels. In particular, the invention can be applied in the context of digital television. The coder 11 and the decoder 18 can then be produced according to a MPEG (moving picture expert group) standard, for example, and the modulator 13 and the demodulator 16 are matched to the propagation channel used (radio, wire, etc.). Another application example is facsimile transmission.

The block code applied by the channel coder 12 is a product code obtained from systematic elementary codes. In the embodiment described below, it is the product of two linear block codes $C_1$, $C_2$ with respective parameters $(n_1, k_1, d_1)$ and $(n_2, k_2, d_2)$.

Figure 2:
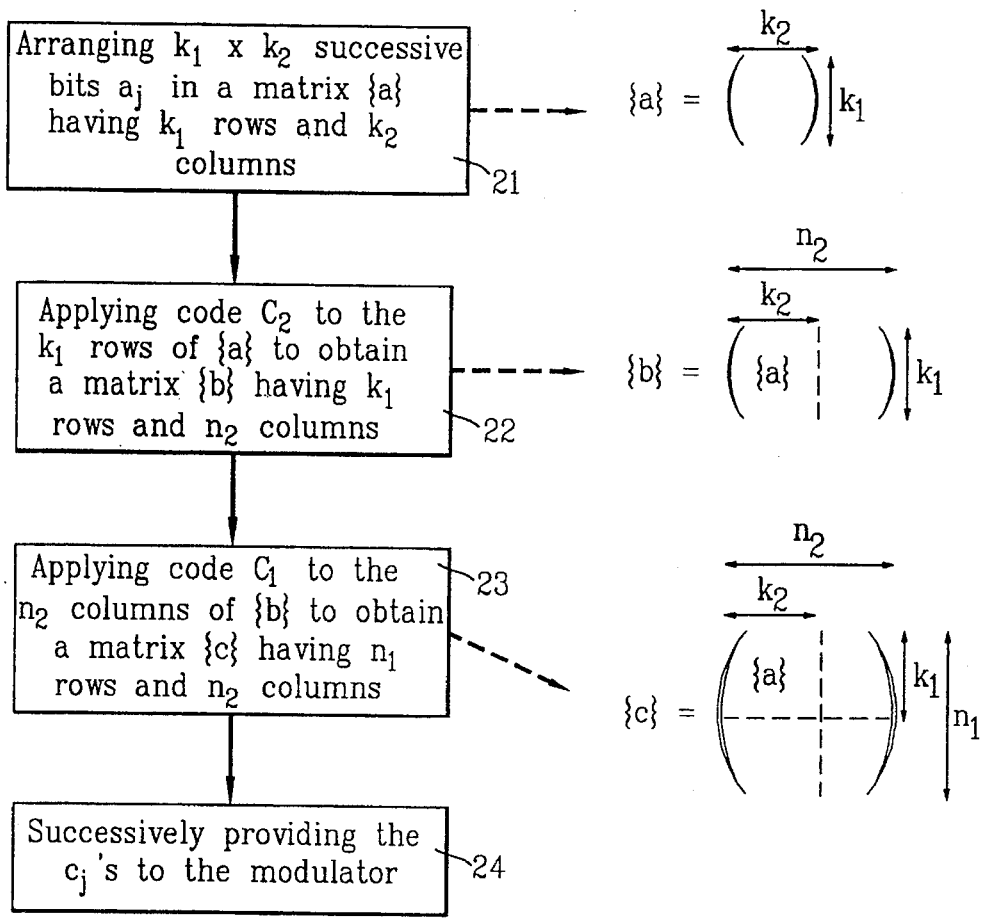
FIG. 2 is a flow chart illustrating the application of a product code.

The coding procedure, carried out with conventional coding circuits, is illustrated in FIG. 2. The bits $a_j$ received successively from the source coder 11 are first of all held, by groups of $k_1 \times k_2$ bits, according to a matrix {a} with $k_1$ rows and $k_2$ columns (step 21). The block code $C_2$ is then applied to each of the $k_1$ rows of the matrix {a}, which supplies a matrix {b} with $k_1$ rows and $n_2$ columns (step 22). As the code $C_2$ is systematic, $k_2$ of the $n_2$ columns of the matrix {b} are identical to the matrix {a}, for example the first $k_2$ columns. Next (step 23), the block code $C_1$ is applied to each of the $n_2$ columns of the matrix {b}, which supplies a matrix {c} with $n_1$ rows and $n_2$ columns, the $c_j$ components of which are the bits transmitted successively to the modulator 13 in the form of the signal Y(t) (step 24). As the code $C_1$ is systematic, $k_1$ of the $n_1$ rows of the matrix {c} are identical to the matrix {b}, for example the first $k_1$ rows. Thus, the upper left part, of $k_1$ rows and $k_2$ columns, of the matrix {c} is identical to the matrix {a}, the other components of the matrix {c} being redundancy bits. All the columns of the matrix {c} are code words of the code $C_1$. Likewise, all the rows of the matrix {c} are code words of the code $C_2$, given that the elementary codes are linear.

Figure 3:
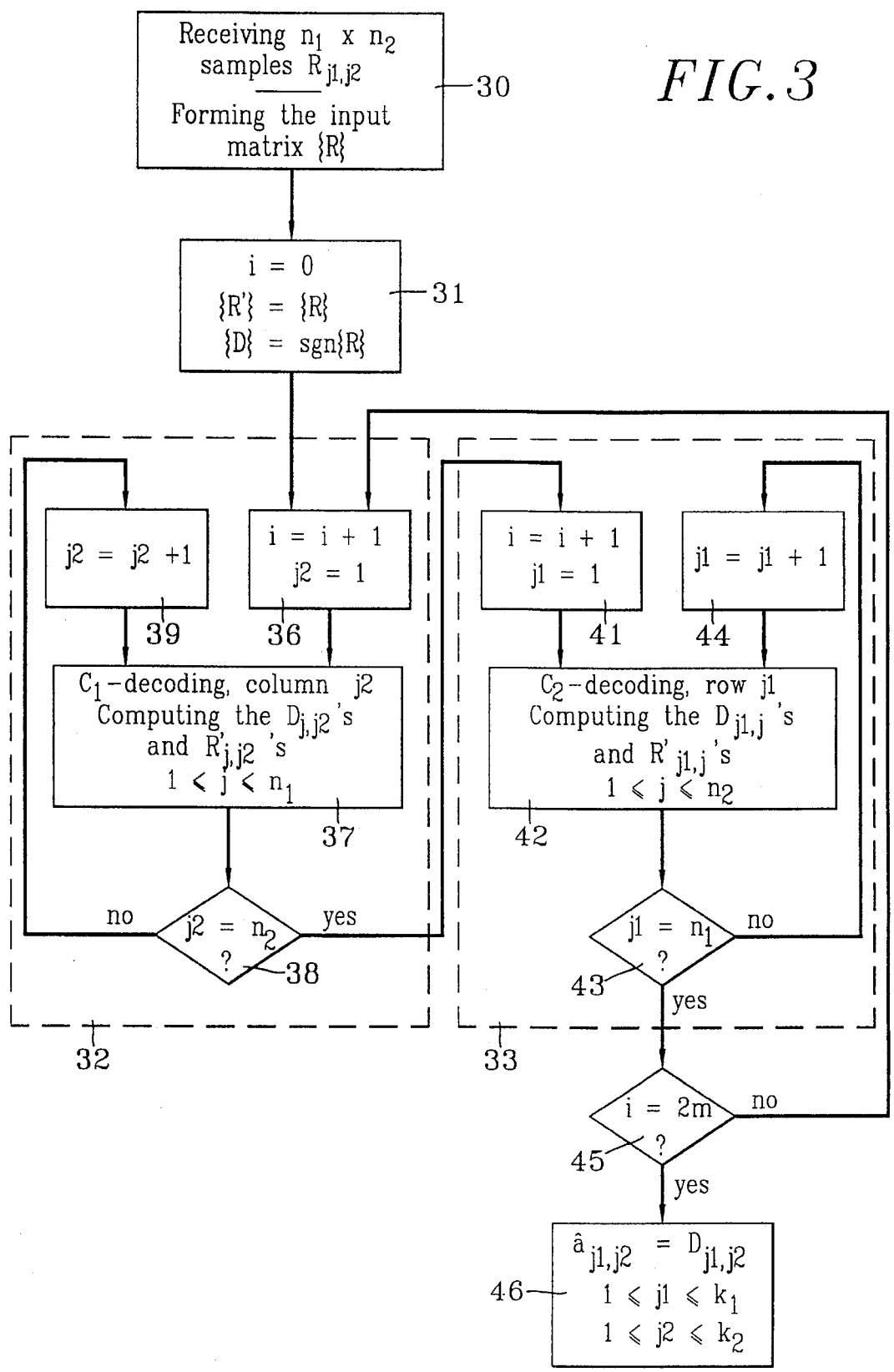
FIG. 3 is a general flow chart of an iterative decoding phase according to the invention.

The channel decoder 17 applies an iterative decoding procedure, the general flow chart for which is presented in FIG. 3. After receiving a $n_1 \times n_2$ block of sample data $R_{j1,j2}$ ($1 \leq j1 \leq n_1$, $1 \leq j2 \leq n_2$) from the signal R(t) received from the demodulator 16, which corresponds to the sending of a coded block formed by the channel coder 12, these samples are held in an input matrix (R) with $n_1$ rows and $n_2$ columns (step 30).

The decoding of this block of $n_1 \times n_2$ sample data is initialized (step 31) by initializing the counting variable i to 0, by forming a data matrix {R'} with $n_1$ rows and $n_2$ columns, the components of which are initially the same as those of the input matrix {R}, and by forming a decision matrix {D} with $n_1$ rows and $n_2$ columns, the components of which are binary (−1 or +1) and, initially, each represent the sign of the corresponding component of the input matrix {R}: $D_{j1,j2}=\text{sgn}(R_{j1,j2})=\pm 1$.

After this initialization, the iterative decoding includes a number m of decoding cycles. Each decoding cycle successively includes a step 32 to search for words of the code $C_1$ in the columns of the data matrix, and a step 33 to search for words of the code $C_2$ in the rows of the data matrix.

At each search step 32 or 33, new values of the components of the decision matrix {D} and of the data matrix {R'} are calculated, which are used for the next search step. Each search step 32 or 33 can be seen as a filtering applied to the data matrix {R'} to reduce the incidence of the noise samples $B_{j1,j2}$ on the components $R'_{j1,j2}$ of this matrix.

The steps 32 and 33 are essentially identical if the role of the rows and of the columns of the matrices would be exchanged. On initialization 36 of the search step 32, the counting variable i is incremented by one unit, and the column index j2 is initialized to 1. A decoding is performed, according to the code $C_1$, of the data word corresponding to the j2-th column of the matrix {R'} (step 37), which supplies new values of the components $D_{j,j2}$ and $R'_{j,j2}$ of the matrices {D} and {R'} ($1 \leq j \leq n_1$). The decoding step 37 is followed by a comparison 38 between the column index j2 and the number of columns $n_2$. When j2 remains lower than $n_2$, the index j2 is incremented by one unit (step 39), then the decoding step 37 is repeated. When j2 becomes equal to $n_2$, all the columns having been processed, the other code word search step 33 of the decoding cycle in progress is commenced. On initialization 41 of the search step 33, the counting variable i is incremented by one unit, and the row index j1 is initialized to 1. Decoding is performed, according to the code $C_2$, of the data word corresponding to the j1-th row of the matrix {R'} (step 42), which supplies new values of the components $D_{j1,j}$ and $R'_{j1,j}$ of the matrices {D} and {R'}. The decoding step 42 is followed by a comparison 43 between the row index j1 and the parameter $n_1$ of the code $C_1$. When j1 remains less than $n_1$, the index j1 is incremented by one unit (step 44), then the decoding step 42 is repeated. When j1 becomes equal to $n_1$, the code word search step 33 is terminated, and the counting variable i is compared to 2m (test 45). When i remains less than 2m, the search step 32 is reentered to commence the following decoding cycle. When i becomes equal to 2m, the m decoding cycles having been accomplished, the $k_1 \times k_2$ decoded information bits $\hat{a}_{j1,j2}$ are extracted from the decision matrix {D} produced during the last code word search step 33. With the systematic codes $C_1$, $C_2$ applied in the way described above with reference to FIG. 2, the $\hat{a}_{j1,j2}$'s can simply be recovered in the first $k_1$ rows and the first $k_2$ columns of the matrix {D}: $\hat{a}_{j1,j2}=D_{j1,j2}$ ($1 \leq j1 \leq k_1$, $1 \leq j2 \leq k_2$). These $\hat{a}_{j1,j2}$'s have values −1 or +1; they can easily be converted to take the values 0 or 1.

Figure 4:
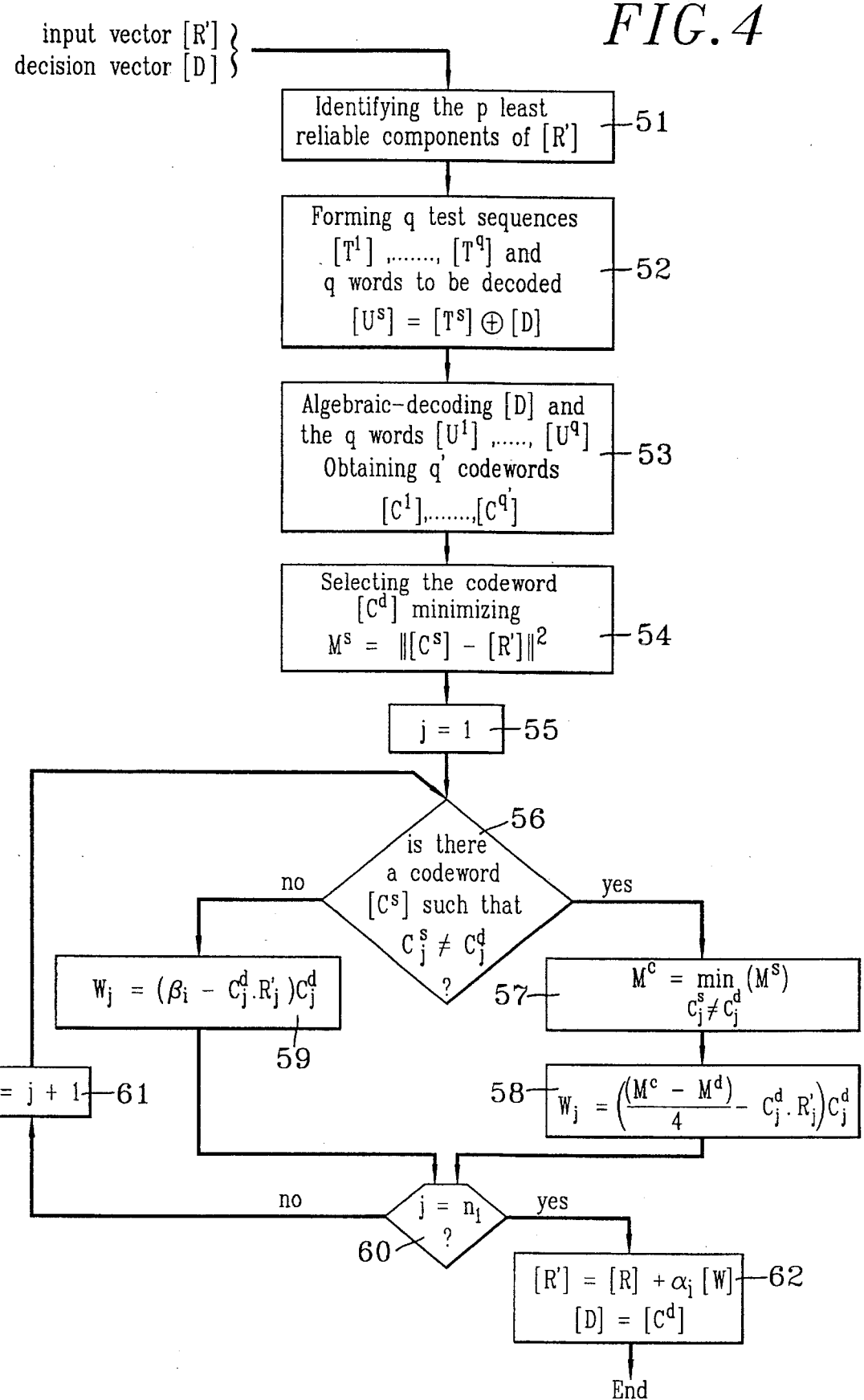
FIG. 4 is a flow chart giving details of a row or column decoding step according to a first implementation of the invention.

The step 37 of decoding a data word corresponding to a column of the data matrix, in a first implementation of the invention, is detailed on the flow chart of FIG. 4. During this step 37, a data vector ]R'] and a decision vector [D], of length $n_1$, are processed, respectively constituting subdivisions of the data matrix {R'} and of the decision matrix {D}: $R'_j=R'_{j,j2}$ and $D_j=D_{j,j2}$ ($1 \leq j \leq n_1$). First of all (step 51) the p least reliable components of the vector [R'], that is to say the components of [R'] which are closest to the binary decision threshold (zero), are marked. The indices corresponding to these p least reliable components are denoted r1, r2, ..., rp, with $|R'_{r1}|<|R'_j| \forall j \neq r1$ $|R'_{r2}|<|R'_j| \forall j \neq r1, r2$ etc. . .

Having identified these p indices, q binary test sequences $[T^1]$, ..., $[T^q]$, of length $n_1$, are constructed, then q binary words to be decoded $[U^1]$, ..., $[U^q]$ of length $n_1$, by combining each of the q test sequences with the decision vector [D] (step 52). Each word $[U^s]$ is constructed in such a way that all its components other than those corresponding to the p indices r1, ..., rp are equal to the corresponding components of the decision vector [D]: $U_j^s=D_j$ for $j \neq r1, \ldots, rp$. It generally suffices to take into account words $[U^s]$ which have only one or two components different from the corresponding components of the vector [D]. All these words are taken into account when $q=p(p+1)/2$. By way of example, when p=6 and q=21, the sequences $[T^s]$ and $[U^s]$ ($1 \leq s \leq q$) can be constructed in the following way:

* the p=6 first test sequences $[T^s]$ have one bit equal to +1 in position rs and bits equal to −1 at the other positions: $T_{rs}^s=+1$ and $T_j^s=-1$ for $1 \leq s \leq 6$ and $j \neq rs$;

| | | |
|---|---|---|
| * $[T^7] = [T^1] \oplus [T^2]$ | $[T^{15}] = [T^2] \oplus [T^6]$ | |
| $[T^8] = [T^1] \oplus [T^3]$ | $[T^{16}] = [T^3] \oplus [T^4]$ | |
| $[T^9] = [T^1] \oplus [T^4]$ | $[T^{17}] = [T^3] \oplus [T^5]$ | |
| $[T^{10}] = [T^1] \oplus [T^5]$ | $[T^{18}] = [T^3] \oplus [T^6]$ | |
| $[T^{11}] = [T^1] \oplus [T^6]$ | $[T^{19}] = [T^4] \oplus [T^5]$ | |
| $[T^{12}] = [T^2] \oplus [T^3]$ | $[T^{20}] = [T^4] \oplus [T^6]$ | |
| $[T^{13}] = [T^2] \oplus [T^4]$ | $[T^{21}] = [T^5] \oplus [T^6]$ | |
| $[T^{14}] = [T^2] \oplus [T^5]$ | | | where $\oplus$ designates the exclusive-OR operation, component by component, between two vectors:

* $[U^s]=[T^s] \oplus [D]$ for $1 \leq s \leq q$

At the following step 53, algebraic decoding of the decision vector [D] and of the q words $[U^s]$ is performed. For this algebraic decoding, in the case of BCH codes, a Berlekamp decoder is used, for example, which is well known in the field of block coding (see E. R. Berlekamp, "Algebraic Coding Theory", Mc Graw-Hill, New York, 1968). The q+1 elementary decodings supply q' code words $[C^1], \ldots, [C^{q'}]$ of the code $C_1$. In the general case, $q' \leq q+1$, since, on the one hand, certain code words may appear several times in the decoding results, and, on the other hand, the algebraic decoder may not find certain code words if the signal is very distorted. The words supplied as a result of algebraic decoding thus have to be checked in order to determine whether they do or do not constitute words of the code $C_1$. This checking can be performed simply by multiplying each word obtained by the parity check matrix relative to the code $C_1$, and by eliminating the word if the result of the multiplication is not zero. However, in the case in which the code $C_1$ is perfect (that is to say that no word of $n_1$ bits is spaced from all the possible code words by more than $(d_1-1)/2$, which is the case particularly for the Hamming codes), the step of checking the results from the algebraic decoder is pointless.

Among the q' code words found, the one $[C^d]$ which exhibits the smallest euclidean distance $M^d=\|[C^d]-[R']\|^2$ with the data vector $[R']$ is selected (step 54).

Next a loop is performed for calculating the components $W_j$ of a correction vector $[W]$ ($1 \leq j \leq n_1$). At the start of this loop (step 55), the component index j is initialized to 1. At each iteration in this loop, a test step 56 is performed to determine whether, among the q' code words found at step 53, there exists at least one $[C^s]$ therein, having its j-th component different from that of the selected code word $[C^d]$ ($C_j^s \neq C_j^d$). If one or more code words $[C^s]$ exist satisfying this condition, the smallest euclidean distance $M^c$ between the data vector $[R']$ and any one of these code words is determined (step 57):

$$M^c = \min_{C_j^s \neq C_j^d} (\|[C^s] - [R']\|^2)$$

The code word $[C^c]$ which exhibits this distance $M^c$ with respect to the data vector $[R']$ is called the concurrent word relative to the j-th component. The component $W_j$ is then calculated at step 58 according to the formula:

$$W_j = \left( \frac{M^c - M^d}{4} - C_j^d \cdot R_j' \right) \cdot C_j^d$$

It will be observed that the quantity $M^c-M^d$ occurring in this formula is always positive, so that $|M^c-M^d|=M^c-M^d$. If the test step 56 reveals no code word $[C^s]$ such that $C_j^s \neq C_j^d$, that is to say if no concurrent word can be determined, the component $W_j$ is calculated at step 59 according to the formula:

$$W_j = (\beta_i - C_j^d \cdot R_j') \cdot C_j^d \qquad (2)$$

where $\beta_i$ designates a positive confidence coefficient. After calculation of the correction component $W_j$, the component index j is compared to the length $n_1$ of the vector $[R']$ (step 60). When j remains lower than $n_1$, the index j is incremented by one unit (step 61), and the following iteration is performed, starting with the test 56.

When j becomes equal to $n_1$, the loop is terminated, and the decoding step 37 terminates with the updating 62 of the data vector $[R']$ and of the decision vector $[D]$. The new vector $[R']$ is taken to be equal to the sum of the input vector $[R]$ (each component $R_j$ of which is extracted from the input matrix $\{R\}$: $R_j=R_{j,j2}$), and of the correction vector $[W]$ multiplied by another positive confidence coefficient $\alpha_i$: $[R']=[R]+\alpha_i[W]$. The new decision vector $[D]$ is taken to be equal to the code word $[C^d]$ selected at step 54.

According to an advantageous variant of the first implementation of the invention, the formula (2) applied when appropriate at step 59 is replaced by:

$$W_j = \beta_i C_j^d \qquad (2')$$

which procures a correction $W_j$ directly proportional to the sign of the new decision $C_j^d$. Other formulae bringing a confidence coefficient into play could also be used when no concurrent word is identified.

Given that, in the first implementation of the invention, the decision vector determined at the preceding iteration does not occur in the loop for calculating the correction vector $[W]$, it is immaterial whether the decision vector $[D]$ is updated before this loop (for example after the selection step 54) or after this loop (for example at the same time as the updating 62 of the data vector $[R']$ as FIG. 4 illustrates).

The steps 42 of decoding of data words corresponding to rows of the data matrix are similar to the steps 37 detailed above with reference to FIG. 4, by replacing the code $C_1$ by the code $C_2$, and the length $n_1$ by the length $n_2$, and by dividing the matrices $\{R'\}$, $\{D\}$, $\{R\}$ not into column vectors $[R']$, $[D]$, $[R]$, but into row vectors.

The confidence coefficients $\alpha_i$ and $\beta_i$ are assigned an index which corresponds to the counting variable i of the flow chart of FIG. 3. Indeed, these coefficients $\alpha_i$, $\beta_i$ may vary from one search step 32, 33 to another. For preference, the $\alpha_i$ and $\beta_i$ values increase as the code word search steps 32, 33 proceed, in order to take account of the increasing reliability of the decoding.

The applicant has tested the method described above by reference to FIGS. 1 to 4 for different codes produced in the context of digital simulations. The modulation in question for the signal sent was biphase phase shift keying (BPSK), and the propagation channel was modelled by a channel with additive white Gaussian noise. The test sequences $[T^s]$ and the words to be decoded $[U^s]$ were determined at step 52 in the way detailed above, with p=6 and q=21. Results are set out below in the case of three high-efficiency product codes, obtained from elementary systematic codes of the Bose-Chaudhuri-Hocquenghem (BCH) type.

Example 1: $C_1=C_2=$BCH (63,57,3)

The BCH (63,57,3) code is a Hamming code and is thus perfect. The product code thus presents the following properties:

—minimal Hamming distance d=9

—coding efficiency R=0.82

—coding gain G<8.7 dB

The confidence coefficients $\alpha_i$, $\beta_i$ were chosen in the following way:

| | |
|---|---|
| $\alpha_1 = 0.2$ | $\beta_1 = 0.5$ |
| $\alpha_2 = 0.3$ | $\beta_2 = 0.5$ |
| $\alpha_3 = 0.4$ | $\beta_3 = 1.0$ |
| $\alpha_4 = 0.4$ | $\beta_4 = 1.5$ |
| $\alpha_5 = 0.5$ | $\beta_5 = 1.5$ |
| $\alpha_6 = 0.5$ | $\beta_6 = 2.0$ |
| $\alpha_7 = 0.7$ | $\beta_7 = 2.0$ |
| $\alpha_8 = 0.7$ | $\beta_8 = 3.0$ |
| $\alpha_9 = 0.8$ | $\beta_9 = 3.0$ |
| $\alpha_{10} = 0.8$ | $\beta_{10} = 4.0$ |

Example 2: $C_1=C_2=$BCH (63,51,5)

The product code thus presents the following properties:

—minimal Hamming distance d=25

—coding efficiency R=0.66

—coding gain G<12 dB

The confidence coefficients $\alpha_i$, $\beta_i$ were chosen in the following way:

$\alpha_1 = 0.3 \quad \beta_1 = 0.5$ $\alpha_2 = 0.3 \quad \beta_2 = 0.5$ $\alpha_3 = 0.4 \quad \beta_3 = 1.0$ $\alpha_4 = 0.4 \quad \beta_4 = 1.5$ $\alpha_5 = 0.5 \quad \beta_5 = 1.5$ $\alpha_6 = 0.5 \quad \beta_6 = 2.0$ $\alpha_7 = 0.5 \quad \beta_7 = 2.0$ $\alpha_8 = 0.5 \quad \beta_8 = 3.0$ $\alpha_9 = 0.6 \quad \beta_9 = 3.0$ $\alpha_{10} = 0.6 \quad \beta_{10} = 5.0$ Example 3: $C_1 = C_2 = $ BCH (127,113,5)
The product code then presents the following properties:
—minimal Hamming distance d=25
—coding efficiency R=0.79
—coding gain G<13 dB The confidence coefficients $\alpha_i$, $\beta_i$ were chosen in the same way as in Example 2.

Figure 5:
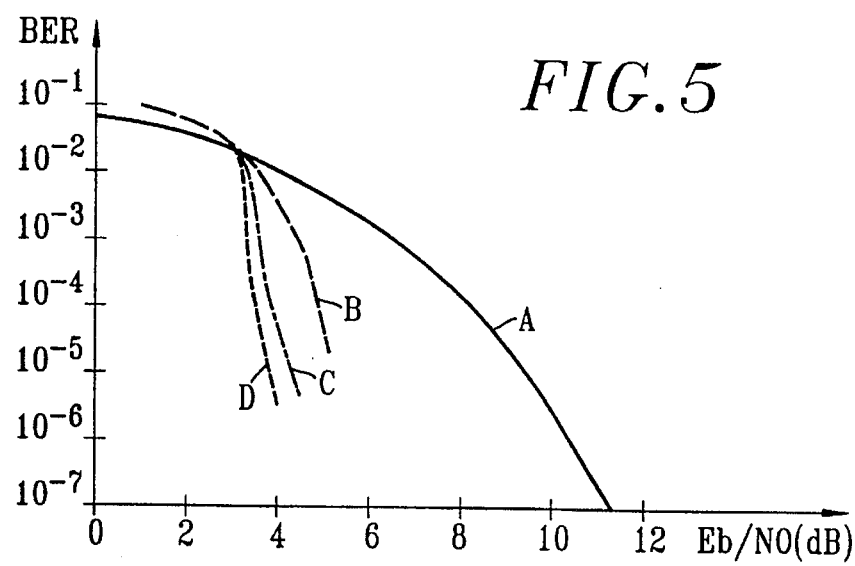
FIGS. 5 to 7 are graphs illustrating performance aspects of the iterative decoding according to the first implementation, in three examples of product codes.
Figure 6:
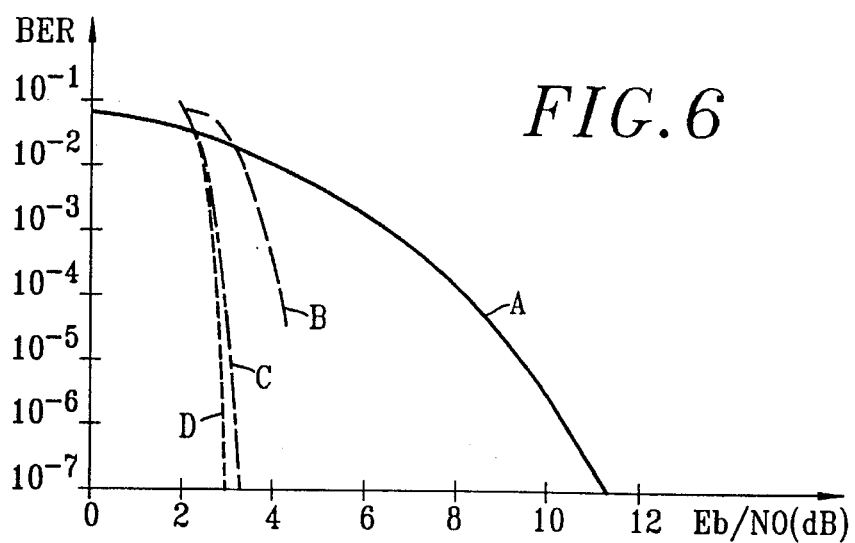
Figure 7:
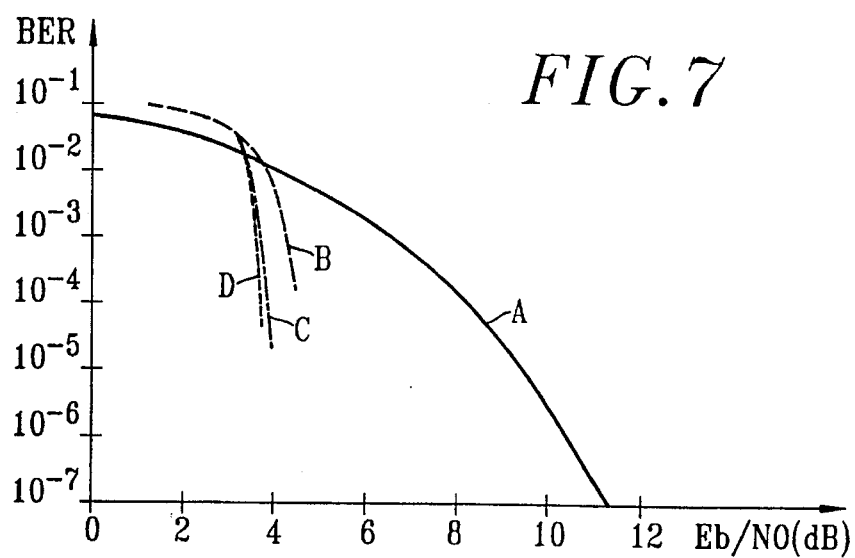

In each of the three examples, the dependence between the binary error rate (BER) and the ratio Eb/N0, expressed in decibels, between the energy Eb of the transmitted signal per information bit and the spectral density N) of the power of the noise induced during the propagation were estimated. The results for Examples 1, 2 and 3 are illustrated respectively on the graphs of FIGS. 5, 6 and 7.

In each of these graphs, the curve A corresponds to the case where the block coding is not applied, for purposes of comparison, the curve B corresponds to the case where m=1 decoding cycle is carried out (that is to say 2m=2 code word search steps 32, 33), the curve C corresponds to the case where m=3 decoding cycles are carried out, and the curve D corresponds to the case where m=5 decoding cycles are carried out. It is thus possible to evaluate the enhancement in the binary error rate procured by the iterative decoding procedure.

In the second implementation of the invention, the concurrent word [$C^c$] is not chosen from among the code words originating from the algebraic decodings. The decision vector [D] is considered as the only possible concurrent word relative to each component $W_j$, although it does not necessarily constitute a code word $C_1$. Consequently, there is no need to decode as many words as in the first implementation. Typically, this would give p=q=3, each word to be decoded [$U^s$] differing from the decision vector [D] by a single one of its components. The flow chart of FIG. 3 remains valid for the second implementation, as do the steps 51 to 54 illustrated in FIG. 4. The loop for calculating the components $W_j$ of the correction vectors [W] can be performed in the way represented in FIG. 8. On initialization 550 of the component index j, the distance $M^c = \|[D]-[R']\|^2$ between the candidate concurrent word [D] and the data vector [R'] is additionally calculated. On each iteration in the loop, the respective j-th components of the decision vector [D] and of the code word [$C^d$] selected at step 54 are compared (test 560) If $D_j = C_j^d$, no concurrent word is adopted relatively to the j-th component, and $W_j = \beta_i C_j^d$ is taken at step 590. If $D_j \neq C_j^d$ the vector [D] is adopted as concurrent word and the following calculation is performed, at step 580:

$$W_j = \frac{|M^c - M^d|}{4} C_j^d - R_j'$$

After calculation of the correction component $W_j$, the index j is compared with the length $n_1$ of the vector [R'] (step 600). When j remains less than $n_1$, the index j is incremented by one unit (step 610), and the following iteration is performed, starting with the test 560. When j becomes equal to $n_1$, step 62 is entered for updating the vectors [R'] and [D] as in the case of FIG. 4.

The fact of taking the decision vector [D] as the only possible concurrent word constitutes a less accurate processing than that used in the first embodiment. Hence, it is desirable for this processing not to be applied in such a way as to modify initially reliable components of the input vector [R], particularly during the first iterations. For that reason, it is possible to perform steps 53 and 54 (FIG. 4) in the way illustrated in FIG. 9. On completion of step 52, the counting variable t is initialized to 1 and the distance $M^d$ to an arbitrarily large number (step 524). At step 525, algebraic decoding of the t-th word to be decoded is performed in order to obtain a binary word [$E^t$] (there are a total of q+1 words to be decoded: the previous decision vector [D] and the q words [$U^s$] constructed at step 52). If the code $C_1$ is not a perfect code, it is checked, at 526, whether the binary word [$E^t$] belongs to the code $C_1$, by multiplying it by the parity check matrix of the code $C_1$. If negative, the word [$E^t$] is eliminated and, at 527, the variable t is compared with the number q+1. When t becomes equal to q+1, all the decodings have been done and the step 550 described previously with reference to FIG. 8 is entered. If the comparison 527 shows that t remains lower than q+1, the variable t is incremented by one unit at 528, and the decoding step 525 is again entered for the following word.

If the parity check 526 shows that the word [$E^t$] belongs to the code $C_1$, a loop is performed for verifying the components of the word [Et]. On initialization 529 of this loop, the component index j is initialized to 1 and the number L to 0. At each iteration in this loop the sign of the j-th component $R_j$ of the input vector [R] is compared, at 530, with the binary value of the j-th component $E_j^t$ of the word [$E^t$]. If sgn($R_j$)=$E_j^t$, step 532 is entered. The condition sgn($R_j$)≠$E_j^t$ conveys the fact that the possible selection of the word [$E^t$] would invert the sign of the binary decision with respect to the value of $R_j$, which it is desired to prohibit if this value of $R_j$ is relatively reliable. Thus, if the comparison 530 shows that sgn($R_j$)≠$E_j^t$, the absolute value of $R_j$ is compared at 531 with a threshold $\gamma_i$. If $|R_j|>\gamma_i$, the component $R_j$ is considered to be reliable and thus the word [$E^t$] is eliminated, by passing directly to the test 527. If the comparison 531 shows that $|R_j|<\gamma_i$, the word [$E^t$] is considered to be acceptable as far as its j-th component is concerned, and step 532 is entered. At step 532, there is added to the number L the quantity $(E_j^t - R_j')^2$. Next the j-component index is compared with the length $n_1$ of the vectors (test 533). If $j<n_1$, the test 533 is followed by incrementation 534 of the index j, and by the comparison 530 relative to the following iteration. If the test 533 shows that $j=n_1$, the word [$E^t$] has been accepted for all its components (in other words sup $\{|j|/\text{sgn}(R_j)\neq E_j^t\}<\gamma_i$), and then forms part of the q' code words capable of being selected to form the next decision vector, the number L being equal to its euclidean distance with respect to the data vector [R'].

Figure 8:
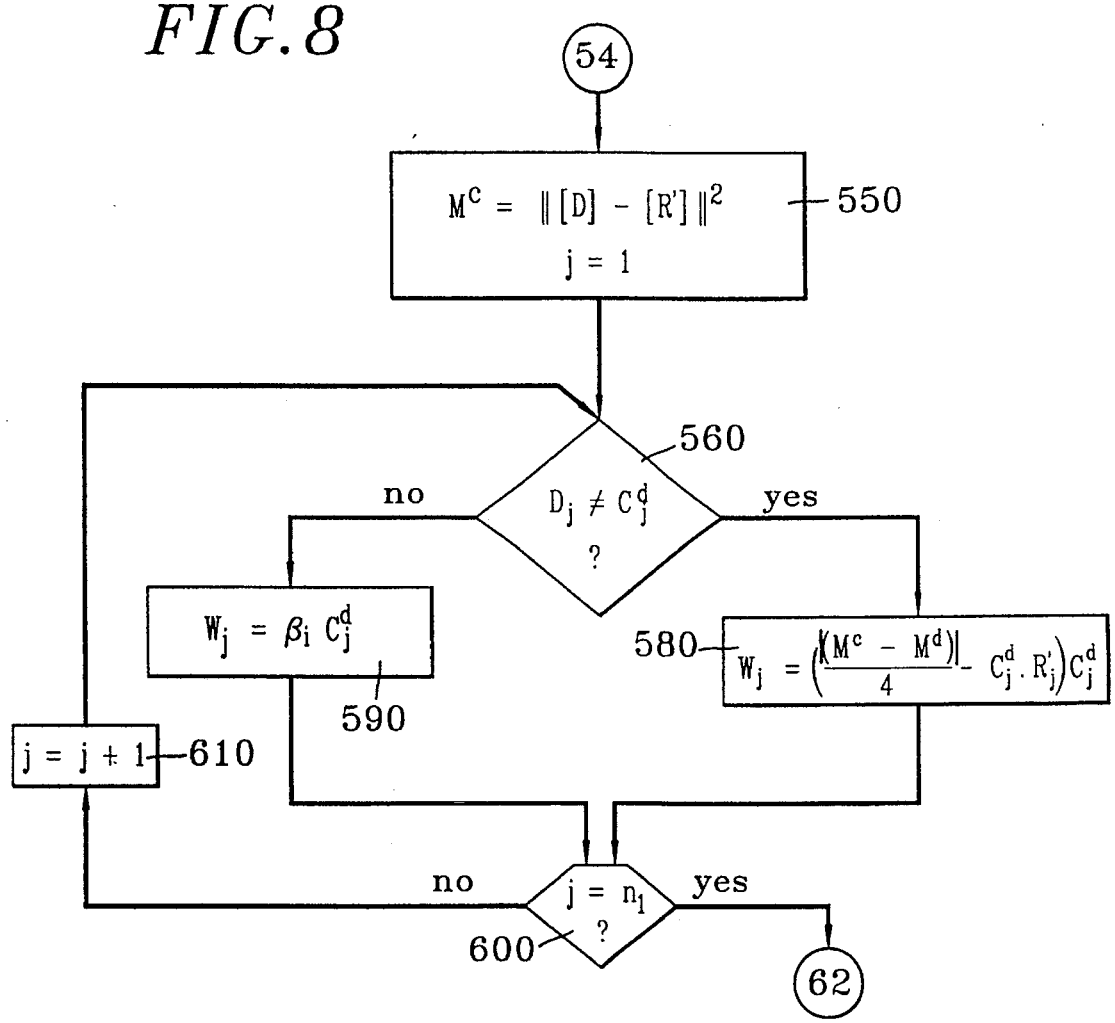
FIG. 8 partially illustrates a variant of the flow chart of FIG. 4 according to a second implementation of the invention.

Once the word [$E^t$] has been adopted among the said q' code words, the numbers L and $M^d$ are compared (test 535). If $L<M^d$, the new value of $M^d$ is taken to be equal to L, at 536, and the word [$C^d$] is taken to be equal to [$E^t$], then test 527 is entered. If the test 535 shows that $L \geq M^d$, the test 527 is entered directly. Hence, when all the decodings have been done and the words obtained verified (test 527 positive), the word [$C^d$] is the acceptable code word having the shortest euclidean distance with respect to the vector [R'], and this minimum distance is equal to $M^d$. The process illustrated in FIG. 8 is then entered.

If the code $C_1$ is perfect, step 526 is dispensed with, the decoding 525 being followed directly by initialization 529 of the loop for verifying the components of the word [E′].

The threshold $\gamma_i$ is assigned an index which corresponds to the counting variable i of the flow chart of FIG. 3. For preference, the threshold $\gamma_i$ increases in step with the code word search steps 32, 33, in order to take account of the increasing reliability of the decoding.

Figure 9:
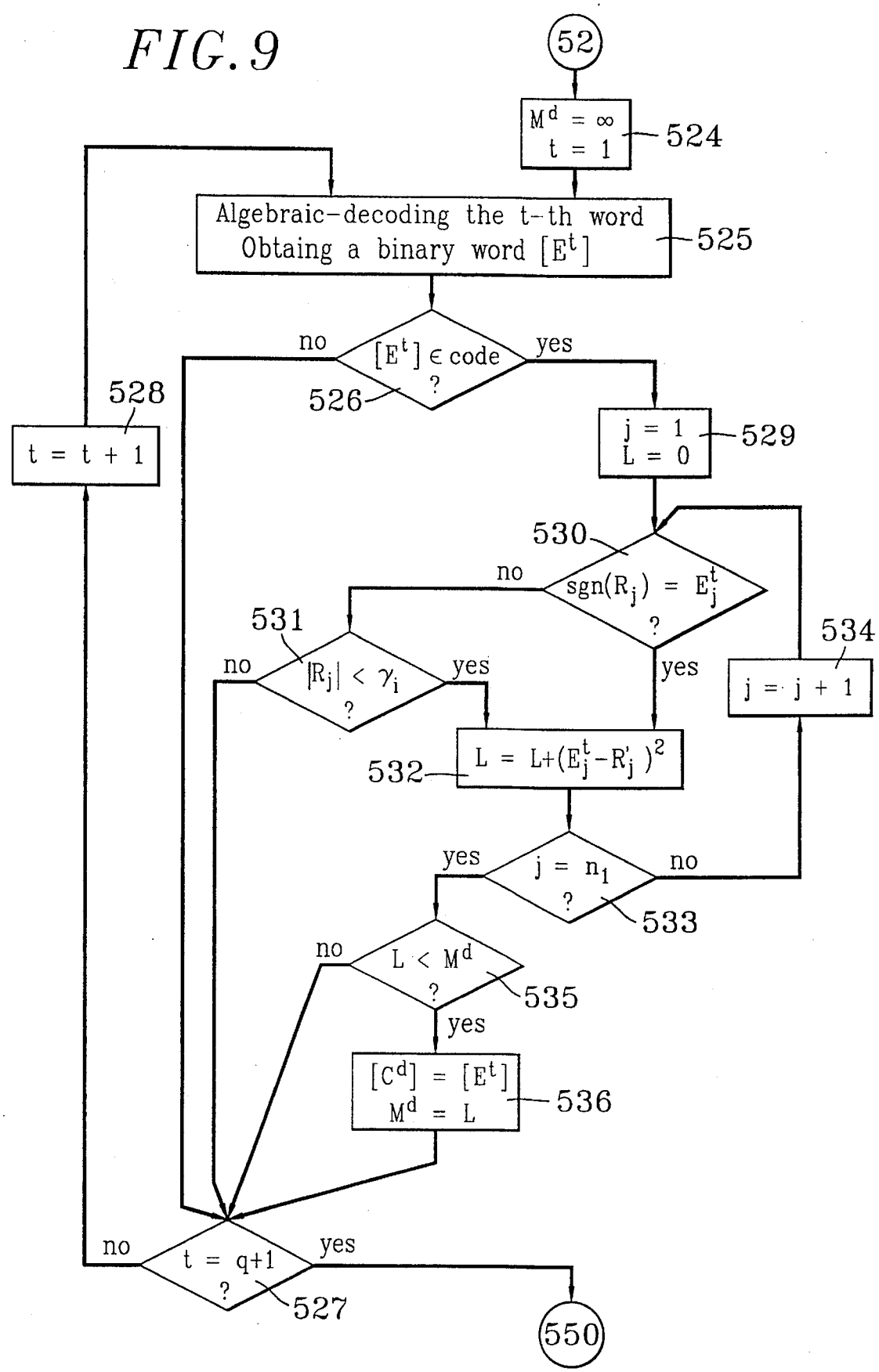
FIG. 9 is a flow chart showing one way of selecting the code words in the second implementation.

The flow chart of FIG. 9 shows a certain interleaving between the functions corresponding to the blocks 53 and 54 in FIG. 4. It will be understood that the order of executing the principal functions of the invention, as well as the possible interleaving of these functions can vary to a fairly large extent, it being essentially a question of choice to be made during the programing of the processing circuits of the decoder.

The procedures illustrated in FIGS. 8 and 9 have been described in the context of the data word decoding steps 37 corresponding to columns of the data matrix (FIG. 3). They are, obviously, directly transposable to the case of the rows (decoding steps 42).

Example 4: $C_1=C_2=BCH$ (64,57,4)

The applicant has tested the second implementation of the method, as described with reference to FIGS. 8 and 9, with p=q=3. The type of channel considered in this simulation was the same as that of Examples 1 to 3. The product code exhibits the following properties:

—minimal Hamming distance d=16

—coding efficiency R=0.79

—coding gain G<11 dB

The coefficients $\alpha_i$, $\beta_i$, $\gamma_i$ were chosen in the following way:

$$\alpha_1 = 0.3 \quad \beta_1 = 0.2 \quad \gamma_1 = 0.5$$
$$\alpha_2 = 0.5 \quad \beta_2 = 0.3 \quad \gamma_2 = 0.7$$
$$\alpha_3 = 0.7 \quad \beta_3 = 0.5 \quad \gamma_3 = 1.0$$
$$\alpha_4 = 0.9 \quad \beta_4 = 0.7 \quad \gamma_4 = 1.5$$
$$\alpha_5 = 1.0 \quad \beta_5 = 0.9 \quad \gamma_5 = 2.0$$
$$\alpha_6 = 1.1 \quad \beta_6 = 1.0 \quad \gamma_6 = 2.5$$
$$\alpha_7 = 1.2 \quad \beta_7 = 1.1 \quad \gamma_7 = 3.0$$
$$\alpha_8 = 1.2 \quad \beta_8 = 1.2 \quad \gamma_8 = 4.0$$

Figure 10:
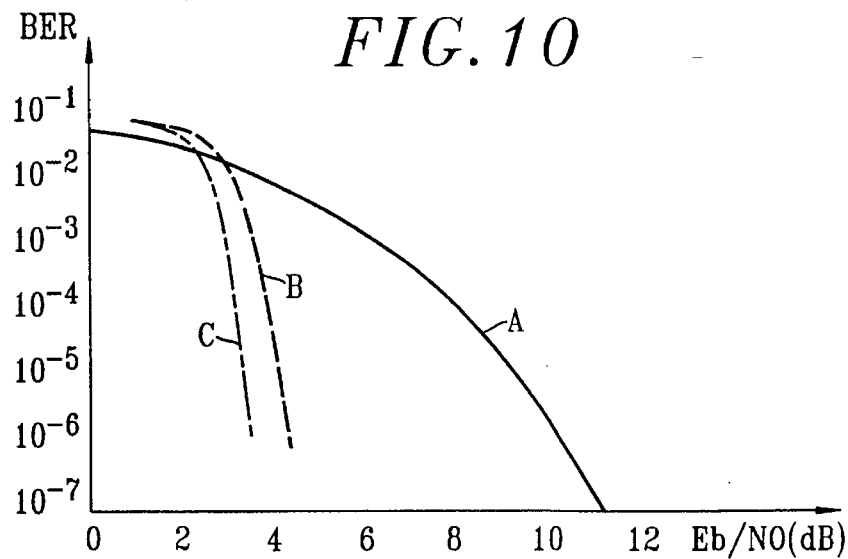
FIG. 10 is a comparative graph illustrating the performance of the first and second implementations of the invention.

FIG. 10 shows the BER obtained for different values of the ratio Eb/N0 in the case of Example 4. The curve A corresponds to the case where the block coding is not applied, the curve B corresponds to m=4 decoding cycles according to the second implementation of the method, and the curve C corresponds to m=4 decoding cycles according to the first implementation of the method, and the curve C corresponds to m=4 decoding cycles according to the first implementation in the same simulation conditions as in Examples 1 and 3 and with the values of the $\alpha_i$ and $\beta_i$ indicated above. The second implementation represents an excellent comprise between the decoding performance and the complexity of implementation. The first implementation exhibits the best performance (enhancement of the order of 0.7 dB for a BER of $10^{-5}$), and could be adopted particularly in applications where simplicity of implementation is not a critical factor.

Obviously, the decoding procedure of the method according to the invention may be executed according to a flow chart which differs somewhat from those previously illustrated. For example, instead of transmitting the matrix {R'} from one code word search step 32, 33 to the next, it is possible to transmit a correction matrix {W}, the components of which are calculated, for each column or row, as indicated in steps 58 and 59 in FIG. 4 or in steps 580 and 590 in FIG. 8. In this case, the last step 62 of the flow chart of FIG. 4 does not form part of the decoding steps 37 or 42. The data vectors [R'] are formed at the start of each decoding step 37 or 42 by adding, to a row or column vector [R] of the input matrix, the corresponding row or column vector of the matrix {W}, multiplied by the coefficient $\alpha_{i-1}$ (with $\alpha_0=0$). The matrices {R'}, {R} and {W} being related, it is equivalent, for transmitting the data matrix, to storing {R} and {R'} in memory, as previously indicated, or storing {R} and {W}.

The algebraic decodings performed at steps 53 or 525 may be carried out by means of conventional decoder circuits. A single decoder circuit is necessary, moreover, when the elementary codes are the same. The rest of the iterative decoding procedure may easily be performed by programming an appropriate processor, or also by using an application-specific circuit.

It will be noted that the method according to the invention is applicable to the case in which the product code results from a product of more than two elementary codes. The matrices processed then have more than two dimensions, and each decoding cycle includes a corresponding number of code word search steps.

Figure 11:
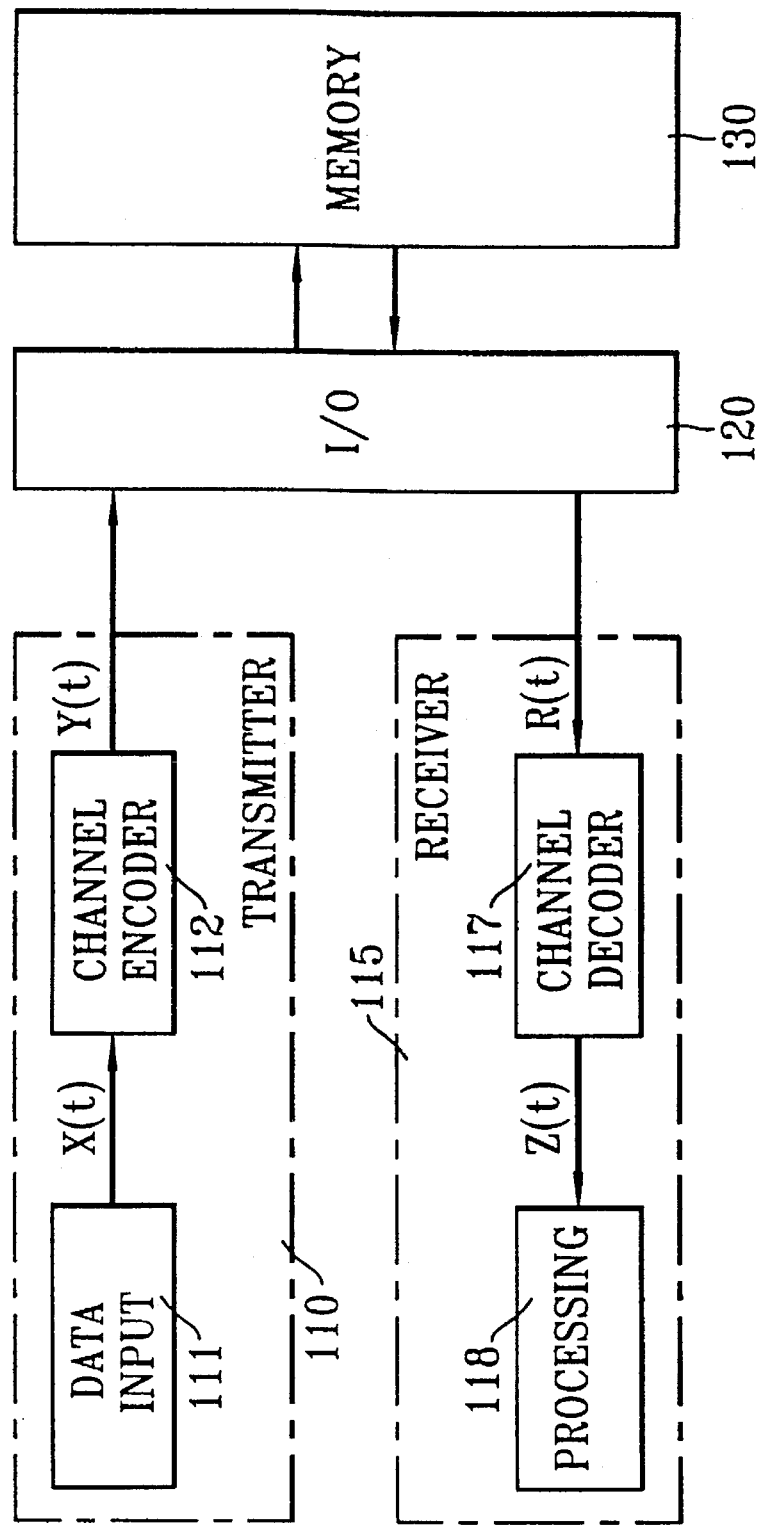
FIG. 11 is a block diagram of a digital information storage system which can be used to implement the invention.

FIG. 11 shows a variant of the transmission chain of FIG. 1 in which the propagation channel comprises a memory 130, for example a magnetic-tape memory or a CD-ROM unit. The transmitter 110 produces a coded digital signal Y(t) which a channel coder 112 obtains in the way previously described from information bits X(t) supplied by a data input device 111. The input device 111 may be a source coder as previously explained. It may also be a computer delivering data to be stored in memory, this computer moreover being capable of carrying out the functions of the channel coder 112. The coded signal Y(t) is addressed, directly or via a transmission line, to the interface 120 of the memory 130 for writing. A receiver 115 for receiving the information thus stored comprises a channel decoder 117 which can be connected directly or indirectly to the interface 120 for reading a signal R(t) generally exhibiting a certain amount of distortion with respect to the write signal Y(t). The decoder 117 applies one of the methods described above in order to supply an estimate signal Z(t). This signal Z(t) is supplied to a processing device 118. The processing applied by the device 118 may comprise, for example, another storing of the information Z(t), calculations on the basis of this information, or a representation of a physical entity which this information characterizes (display of motion or still pictures, sound reproduction, printing of a document, etc.). The device 118 will often comprise processing circuits, additionally carrying out the functions of the decoder 117.

We claim:

1. Method for detecting information bits in a coded digital signal, within a receiver, the coding of the said digital signal having been performed within a transmitter by applying, to information bits to be transmitted, a block code corresponding to the product of at least two elementary systematic block codes, the method comprising an iterative decoding phase including a number m of decoding cycles, each decoding cycle successively including code word search steps for each elementary block code used in the product code, wherein, at each code word search step, a data matrix and a decision matrix with binary components are received which, before the first search step of the iterative decoding phase consist respectively of an input matrix consisting of samples of the received signal and of a matrix, the components of which are those of the input matrix put into binary form, and a new decision matrix and a new data matrix are produced for the following search step, wherein decoded information bits are extracted from the decision matrix produced during the last code word search step, and wherein each code word search step includes a division of the data matrix received into data vectors each corresponding to a code word of the elementary code and a corresponding division of the decision matrix received into decision vectors, and the following substeps for respectively processing at least some of the data vector/decision vector pairs:

determining a number p of indices for which the components of the data vector are the least reliable;

constructing a number q of binary words to be decoded from the said p indices and from the decision vector;

obtaining q' code words on the basis of algebraic decodings of the decision vector of the q binary words to be decoded;

selecting, among the q' code words obtained, the one having the smallest euclidean distance from the data vector;

calculating a correction vector, each component $W_j$ of the correction vector being calculated respectively by determining a possible concurrent word having a j-th component different from that of the selected code word, and by applying the formula:

$$W_j = \left( \frac{|M^c - M^d|}{4} - C_j^d \cdot R_j' \right) C_j^d$$

when a concurrent word has been determined, $M^d$ and $M^c$ respectively designating the euclidean distances, with respect to the data vector, of the selected code word and of the concurrent word, and $C_j^d$ and $R_j'$ respectively designating the j-th components of the selected code word and of the date vector;

updating said decision vector by obtaining a new decision vector taken to be equal to the said selected code word; and updating said data vector, a new data vector being calculated by adding the correction vector multiplied by a first confidence coefficient to a corresponding input vector extracted from the input matrix.

2. Method according to claim 1, wherein, in the substep of calculating a correction vector, the determination of a possible concurrent word relative to the j-th component of the selected code word comprises the determination, among the q' code words obtained, of those having their j-th component different from that of the selected code word and the selection as concurrent word of that one of the code words thus determined having the smallest euclidean distance with the data vector, no concurrent word being determined when the q' code words obtained all have their j-th component equal to that of the selected code word.

3. Method according to claim 1, wherein, in the substep of calculating a correction vector, the determination of a possible concurrent word relative to the j-th component of the selected code word comprises a comparison between the j-th component of the decision vector and that of the selected code word, the decision vector being taken as concurrent word when its j-th component is different from that of the selected code word, and no concurrent word being determined in the opposite case.

4. Method according to claim 1, wherein the obtaining of the q' code words comprises, for each code word resulting from the algebraic decoding of the decision vector or of one of the q binary words to be decoded, the identification of the components of the associated input vector having a sign opposite to that of the corresponding component of the said code word, the said code word being adopted among the q' code words only if the absolute values of the said components of opposite sign of the input vector are all less than a preestablished threshold.

5. Method according to claim 4, wherein the threshold increases in step with the code word search steps.

6. Method according to claim 1, wherein the first confidence coefficient increases in step with the code word search steps.

7. Method according to claim 1, wherein the calculation of each component $W_j$ of the correction vector in the absence of determination of a concurrent word relative to said component is performed according to the formula:

$$W_j = \beta_i C_j^d$$

where $\beta_i$ designates a second confidence coefficient.

8. Method according to claim 1, wherein the calculation of each component $W_j$ of the correction vector in the absence of determination of a concurrent word relative to said component is performed according to the formula:

$$W_j = (\beta_i - C_j^d R_j') C_j^d$$

where $\beta_i$ designates a second confidence coefficient.

9. Method according to claim 7, wherein the second confidence coefficient increases in step with the code word search steps.

10. Method according to claim 1, wherein each of the q binary words to be decoded is constructed in such a way that all components thereof other than those corresponding to the p indices for which the components of the data vector are least reliable are equal respectively to the corresponding components of the decision vector.

11. Method according to claim 10, wherein each of the q binary words to be decoded is constructed in such a way as to have one or two components different from the corresponding components of the decision vector.

12. Method according to claim 11, wherein q=p(p+1)/2.

13. Method according to claim 1, wherein the elementary block codes used in the product code are identical.

14. Method for transmitting information bits, comprising:

a coding phase in which a block code, corresponding to the product of at least two elementary systematic block codes, is applied to the information bits to be transmitted;

a phase of modulation and of transmission of a signal obtained from the coded information bits;

a phase of reception of the transmitted signal after propagation and of demodulation; and an iterative decoding phase including a number m of decoding cycles, each decoding cycle successively including code word search steps for each elementary block code used in the product code, wherein, at each code word search step, a data matrix and a decision matrix with binary components are received which, before the first search step of the iterative decoding phase consist respectively of an input matrix consisting of samples of the received signal and of a matrix, the components of which are those of the input matrix put into binary form, and a new decision matrix and new data matrix are produced for the following search step, wherein decoded information bits are extracted from the decision matrix produced during the last code work search step, and wherein each code word search step includes a division of the data matrix received into data vectors each corresponding to a code word of the elementary code and a corresponding division of the decision matrix received into decision vectors, and the following substeps for respectively processing at least some of the data vector/decision vector pairs:

determining a number p of indices for which the components of the data vector are the least reliable;

constructing a number q of binary words to be decoded from the said p indices and from the decision vector;

obtaining q' code words on the basis of algebraic decodings of the decision vector and of the q binary words to be decoded;

selecting, among the q' code words obtained, the one having the smallest euclidean distance from the data vector;

calculating a correction vector, each component $W_j$ of the correction vector being calculated respectively by determining a possible concurrent word having a j-th component different from that of the selected code word, and by applying the formula:

$$W_j = \left( \frac{|M^c - M^d|}{4} - C_j^d \cdot R_j' \right) C_j^d$$

when a concurrent word has been determined, $M^d$ and $M^c$ respectively designating the euclidean distances, with respect to the data vector, of the selected code word and of the concurrent word, and $C_j^d$ and $R_j'$ respectively designating the j-th components of the selected code word and of the data vector;

updating said decision vector by obtaining a new decision vector taken to be equal to the said selected code word; and updating said decision vector, a new data vector being calculated by adding the correction vector multiplied by a first confidence coefficient to a corresponding input vector extracted from the input matrix.

15. Method according to claim 14, wherein, in the substep of calculating a correction vector, the determination of a possible concurrent word relative to the j-th component of the selected code word comprises the determination, among the q' code words obtained, of those having their j-th component different from that of the selected code word and the selection as concurrent word of that one of the code words thus determined having the smallest euclidean distance with the data vector, no concurrent word being determined when the q' code words obtained all have their j-th component equal to that of the selected code word.

16. Method according to claim 14, wherein that, in the substep of calculating a correction vector, the determination of a possible concurrent word relative to the j-th component of the selected code word comprises a comparison between the j-th component of the decision vector and that of the selected code word, the decision vector being taken as concurrent word when its j-th component is different from that of the selected code word, and no concurrent word being determined in the opposite case.

17. Method according to claim 14, wherein the obtaining of the q' code words comprises, for each code word resulting from the algebraic decoding of the decision vector or of one of the q binary words to be decoded, the identification of the components of the associated input vector having a sign opposite to that of the corresponding component of the said code word, the said code word being adopted among the q' code words only if the absolute values of the said components of opposite sign of the input vector are all less than a preestablished threshold.

18. Method according to claim 17, wherein the threshold increases in step with the code word search steps.

19. Method according to claim 14, wherein the first confidence coefficient increases in step with the code word search steps.

20. Method according to claim 14, wherein the calculation of each component $W_j$ of the correction vector in the absence of determination of a concurrent word relative to said component is performed according to the formula:

$$W_j = \beta_i C_j^d$$

where $\beta_i$ designates a second confidence coefficient.

21. Method according to claim 20, wherein the second confidence coefficient increases in step with the code word search steps.

22. Method according to claim 14, wherein each of the q binary words to be decoded is constructed in such a way that all components thereof other than those corresponding to the p indices for which the components of the data vector are least reliable are equal respectively to the corresponding components of the decision vector.

23. Method for retrieving information bits stored in coded from in a memory, the coding of the said bits having been performed by applying a block code corresponding to the product of at least two elementary systematic block bodes, the said method comprising a phase of reading in the memory and a phase of iterative decoding, including a number m of decoding cycles, each decoding cycle successively including code word search steps for each elementary block code used in the product code, wherein, at each code word search step, a data matrix and a decision matrix with binary components are received which, before the first search step of the iterative decoding phase consist respectively of an input matrix consisting of samples of the received signal and of a matrix the components of which are those of the input matrix put into binary form, and a new decision matrix and a new data matrix are produced for the following search step, wherein decoded information bits are extracted from the decision matrix produced during the last code word search step, and wherein each code word search step includes a division of the data matrix received into data vectors each corresponding to a code word of the elementary code and a corresponding division of the decision matrix received into decision vectors, and the following substeps for respectively processing at least some of the data vector/decision vector pair:

determining a number p of indices for which the components of the data vector are the least reliable;

constructing a number q of binary words to be decoded from the said p indices and from the decision vector;

obtaining q' code words on the basis of algebraic decodings of the decision vector and of the q binary words to be decoded;

selecting, among the q' code words obtained, the one having the smallest euclidean distance from the data vector;

calculating a correction vector, each component $W_j$ of the correction vector being calculated respectively by determining a possible concurrent word having a j-th component different from that of the selected code word, and by applying the formula:

$$W_j = \left( \frac{|M^c - M^d|}{4} - C_j^d \cdot R_j' \right) C_j^d$$

when a concurrent word has been determined, $M^d$ and $M^c$ respectively designating the euclidean distances with respect to the data vector, of the selected code word and of the concurrent word, and $C_j^d$ and $R_j'$ respectively designating the j-th components of the selected code word and of the data vector;

updating said decision vector by obtaining a new decision vector taken to be equal to the said selected code word; and updating said data vector, a new data vector being calculated by adding the correction vector multiplied by a first confidence coefficient to a corresponding input vector extracted from the input matrix.

24. Method according to claim 23, wherein, in the substep of calculating a correction vector, the determination of a possible concurrent word relative to the j-th component of the selected code word comprises the determination, among the q' code words obtained, of those having their j-th component different from that of the selected code word and the selection as concurrent word of that one of the code words thus determined having the smallest euclidean distance with the data vector, no concurrent word being determined when the q' code words obtained all have their j-th component equal to that of the selected code word.

25. Method according to claim 23, wherein, in the substep of calculating a correction vector, the determination of a possible concurrent word relative to the j-th component of the selected code word comprises a comparison between the j-th component of the decision vector and that of the selected code word, the decision vector being taken as concurrent word when its j-th component is different from that of the selected code word, and no concurrent word being determined in the opposite case.

26. Method according to claim 23, wherein the obtaining of the q' code words comprises, for each code word resulting from the algebraic decoding of the decision vector or of one of the q binary words to be decoded, the identification of the components of the associated input vector having a sign opposite to that of the corresponding component of the said code word, the said code word being adopted among the q' code words only if the absolute values of the said components of opposite sign of the input vector are all less than a preestablished threshold.

27. Method according to claim 26, wherein the threshold increases in step with the code word search steps.

28. Method according to claim 23, wherein the first confidence coefficient increases in step with the code word search steps.

29. Method according to claim 23, wherein the calculation of each component $W_j$ of the correction vector in the absence of determination of a concurrent word relative to said component is performed according to the formula:

$$W_j = \beta_i C_j^d$$

where $\beta_i$ designates a second confidence coefficient.

30. Method according to claim 29, wherein the second confidence coefficient increases in step with the code word search steps.

31. Method according to claim 23, wherein each of the q binary words to be decoded is constructed in such a way that all components thereof other than those corresponding to the p indices for which the components of the data vector are least reliable are equal respectively to the corresponding components of the decision vector.

* * * * *